(12) United States Patent
Kim et al.

(10) Patent No.: US 10,693,109 B2
(45) Date of Patent: Jun. 23, 2020

(54) METHOD OF MANUFACTURING SUBSTRATE FOR DISPLAY DEVICE AND METHOD OF MANUFACTURING DISPLAY DEVICE

(71) Applicant: Samsung Display Co., Ltd., Yongin-Si, Gyeonggi-Do (KR)

(72) Inventors: Sangwoo Kim, Yongin-si (KR); Jaemin Shin, Yongin-si (KR); Seungwook Kwon, Yongin-si (KR); Minwoo Kim, Yongin-si (KR); Wonsang Park, Yongin-si (KR); Jongho Hong, Yongin-si (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 16/160,704

(22) Filed: Oct. 15, 2018

(65) Prior Publication Data
US 2019/0267576 A1 Aug. 29, 2019

(30) Foreign Application Priority Data
Feb. 28, 2018 (KR) .......................... 10-2018-0024731

(51) Int. Cl.
| H01L 51/56 | (2006.01) |
| H01L 51/00 | (2006.01) |
| H01L 51/52 | (2006.01) |
| H01L 27/32 | (2006.01) |

(52) U.S. Cl.
CPC .......... *H01L 51/56* (2013.01); *H01L 27/3244* (2013.01); *H01L 51/0097* (2013.01); *H01L 51/5246* (2013.01); *H01L 51/5284* (2013.01); *H01L 2227/323* (2013.01); *H01L 2227/326* (2013.01)

(58) Field of Classification Search
CPC . H01L 51/56; H01L 51/0097; H01L 51/5246; H01L 27/3244; H01L 2227/326
See application file for complete search history.

(56) References Cited

U.S. PATENT DOCUMENTS

| 9,276,224 | B2 | 3/2016 | Yamazaki et al. |
| 9,647,043 | B2 | 5/2017 | Hirakata et al. |
| 2002/0146893 | A1 | 10/2002 | Shimoda et al. |
| 2012/0052214 | A1 | 3/2012 | Tsai et al. |
| 2013/0240888 | A1 | 9/2013 | Cho et al. |

FOREIGN PATENT DOCUMENTS

| JP | 2003-100450 A | 4/2003 |
| JP | 2016-197261 A | 11/2016 |
| KR | 10-2013-0104182 A | 9/2013 |
| KR | 10-2015-0074825 A | 7/2015 |

*Primary Examiner* — Anne M Hines
(74) *Attorney, Agent, or Firm* — Innovation Counsel LLP

(57) ABSTRACT

Provided herein is a method of manufacturing a substrate for a display device, the method including: preparing a supporting substrate having a first surface and a second surface opposite to the first surface; patterning a blocking film on the first surface of the supporting substrate; forming a substrate layer on the supporting substrate to cover the blocking film; removing at least a portion of the substrate layer to space the blocking film apart from the substrate layer by a predetermined distance; and separating the substrate layer from the supporting substrate.

21 Claims, 11 Drawing Sheets

METHOD OF MANUFACTURING SUBSTRATE FOR DISPLAY DEVICE AND METHOD OF MANUFACTURING DISPLAY DEVICE

RELATED APPLICATION

This application claims the benefit of Korean Patent Application No. 10-2018-0024731, filed on Feb. 28, 2018, in the Korean Intellectual Property Office, the disclosure of which is incorporated herein in its entirety by reference.

BACKGROUND

1. Field

One or more embodiments relate to a method of manufacturing a substrate for a display device and a method of manufacturing a display device, and more particularly to a method of manufacturing a substrate for a display device, by which various substrate shapes can be easily implemented, and a method of manufacturing a display device.

2. Description of the Related Art

Among display devices, an organic light-emitting display device is attracting considerable attention as a next-generation display device because it has advantages of a wide viewing angle, a high contrast, and a rapid response speed.

In general, an organic light-emitting display device, in which thin film transistors and organic light-emitting elements are formed on a substrate, is operated by emitting light from the organic light-emitting elements themselves. Such an organic light-emitting display device may be used as a display unit of a small product such as a mobile phone, and may also be used as a display unit of a large product such as a television.

Among organic light-emitting display devices, interest in flexible display devices has recently increased, thus, research on flexible display devices has been actively conducted. In order to implement such a flexible display device, a flexible substrate made of a material such as a synthetic resin is used instead of a conventional glass substrate. However, such a flexible substrate has flexible characteristics and thus has a problem in that it is not easy to handle in a manufacturing process or the like. Accordingly, In order to solve such a problem, a flexible substrate is formed on a supporting substrate having sufficient rigidity, subjected to several processes, and then the flexible substrate is separated from the supporting substrate.

However, a method of manufacturing a conventional substrate for a display device and a conventional method of manufacturing a display device are problematic in that, in implementing a display device having various shapes other than a conventional rectangular shape, there is a limitation in manufacturing a substrate, and additional processes are required, thereby complicating a manufacturing process.

SUMMARY

One or more embodiments include a method of manufacturing a substrate for a display device, by which various substrate shapes can be easily implemented, and a method of manufacturing a display device.

Additional aspects will be set forth in part in the description which follows and, in part, will be apparent from the description, or may be learned by practice of the presented embodiments.

According to one or more embodiments, a method of manufacturing a substrate for a display device may include: preparing a supporting substrate having a first surface and a second surface opposite to the first surface; forming a blocking film on the first surface of the supporting substrate; forming a substrate layer on the supporting substrate to cover the blocking film; removing at least a portion of the substrate layer to space the blocking film apart from the substrate layer by a predetermined distance; and separating the substrate layer from the supporting substrate.

In the forming of the substrate layer, at least a portion of the substrate layer may be in contact with the blocking film, and a remaining part thereof may be in contact with the supporting substrate.

The blocking film may include at least one of amorphous silicon (a-Si), poly-Si, crystalline-Si, ZnO, and IZO.

The spacing of the blocking film apart from the substrate layer may include etching at least a portion of the substrate layer.

The blocking film may include a material which absorbs about 90% or more laser beam having a wavelength of about 300 nm.

In the removing at least a portion of the substrate layer, at least a portion of the substrate layer disposed at an interface between the blocking film and the substrate layer is removed.

In the separating of the substrate layer, the substrate layer may be separated from the supporting substrate by irradiating the second surface of the supporting substrate with a laser beam.

In the separating of the substrate layer, the blocking film may not be separated from the supporting substrate when the substrate layer is separated from the supporting substrate.

The substrate layer may be a flexible substrate.

According to one or more embodiments, a method of manufacturing a display apparatus may include: preparing a supporting substrate having a first surface and a second surface opposite to the first surface; patterning a blocking film on the first surface of the supporting substrate; forming a substrate layer on the supporting substrate to cover the blocking film; removing at least a portion of the substrate layer to space the blocking film apart from the substrate layer by a predetermined distance; forming a display unit on the substrate layer, the display unit including a pixel; and separating the substrate layer from the supporting substrate.

The method may further include: forming a sealing layer on the display unit, the sealing layer externally sealing the display unit.

In the forming of the substrate layer, at least a portion of the substrate layer may be in contact with the blocking film, and a remaining part thereof may be in contact with the supporting substrate.

The blocking film may include at least one of amorphous silicon (a-Si), poly-Si, crystalline-Si, ZnO, and IZO.

The blocking film may include a material which absorbs about 90% or more laser beam having a wavelength of about 300 nm.

The removing at least a portion of the substrate layer may include etching at least a portion of the substrate layer.

In the moving at least a portion of the substrate layer spa at least a portion of the substrate layer disposed at an interface between the blocking film and the substrate layer is removed.

In the separating of the substrate layer, the substrate layer may be separated from the supporting substrate by irradiating the second surface of the supporting substrate with a laser beam.

In the separating of the substrate layer, the blocking film may not be separated from the supporting substrate when the substrate layer is separated from the supporting substrate.

The substrate layer may be a flexible substrate.

In the removing at least a portion of the substrate layer, a spacing region in which at least a portion of the substrate layer is exposed through the predetermined distance may be formed, the forming of the display unit may include forming an inorganic layer on the substrate layer, and at least a portion of the inorganic layer may be in contact with the spacing region of the substrate layer.

The method may further include: removing the inorganic layer formed on the spacing region of the substrate layer before the separating of the substrate layer.

These general and specific aspects may be carried out by using a system, a method, a computer program, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
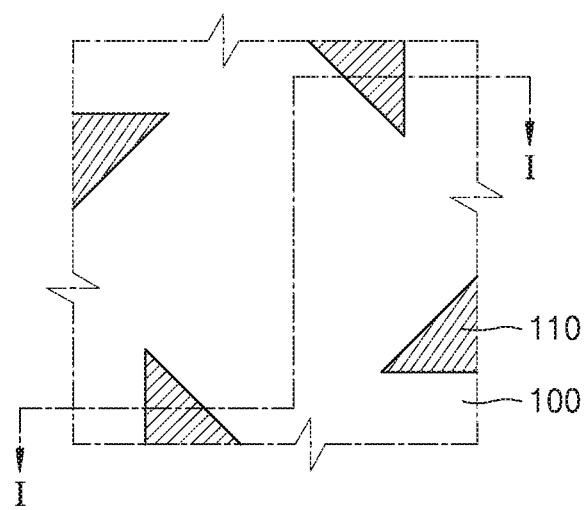
FIGS. 1A and 1B are a plan view and a cross-sectional view schematically illustrating a manufacturing process of a substrate for a display device, according to an embodiment of the present disclosure.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of", when preceding a list of elements, modify the entire list of elements and do not modify the individual elements of the list.

Hereinafter, the inventive concept will be described in detail by explaining exemplary embodiments of the inventive concept with reference to the attached drawings. Like reference numerals in the drawings denote like elements, and thus their description will be omitted.

It will be understood that, although the terms first, second, etc. may be used herein to describe various elements, these elements should not be limited by these terms. These terms are only used to distinguish one element from another. Further, the singular forms "a," "an" and "the" are intended to include the plural forms as well, unless the context clearly indicates otherwise.

It will be understood that the terms such as "include," "comprise," and "have" used herein specify the presence of stated features or components, but do not preclude the presence or addition of one or more other features or components. It will be further understood that when a layer, region, or component is referred to as being "on" another layer, region, or component, it can be directly or indirectly on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

An x-axis, a y-axis and a z-axis are not limited to three axes of a rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2A:
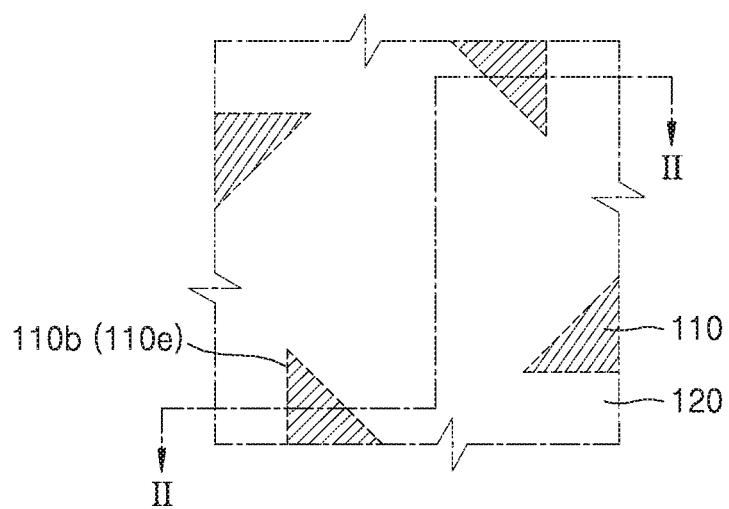
FIGS. 2A and 2B are a plan view and a cross-sectional view schematically illustrating a manufacturing process of a substrate for a display device, according to an embodiment of the present disclosure.
Figure 2B:
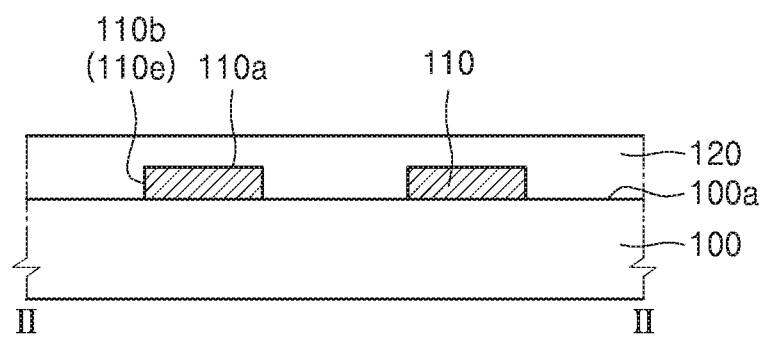
Figure 3A:
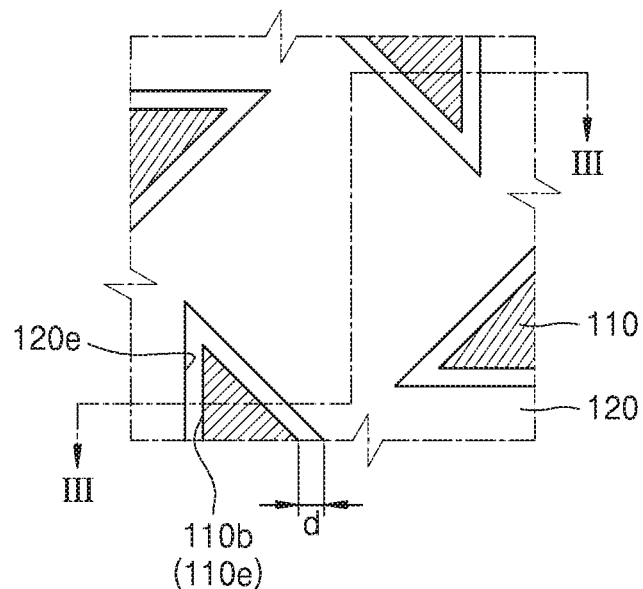
FIGS. 3A, 3B, and 3C are a plan view and cross-sectional views schematically illustrating a manufacturing process of a substrate for a display device, according to an embodiment of the present disclosure.
Figure 3B:
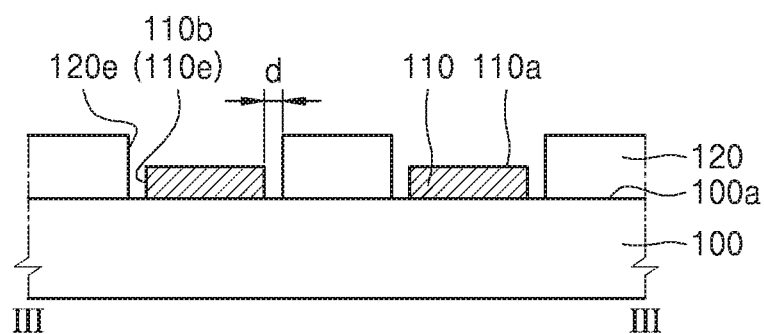
Figure 3C:
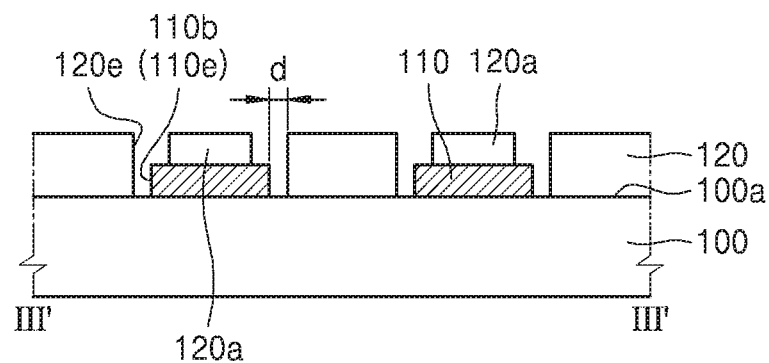
Figure 4A:
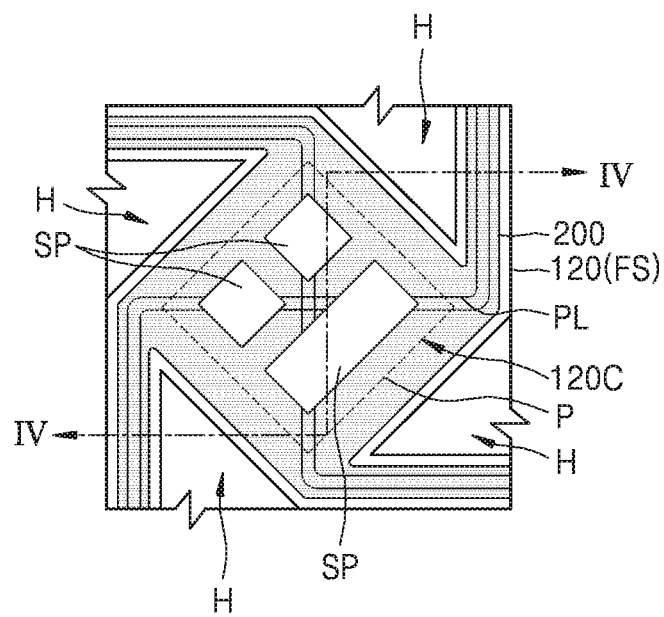
FIGS. 4A and 4B are a plan view and a cross-sectional view schematically illustrating a manufacturing process of a substrate for a display device, according to an embodiment of the present disclosure.
Figure 4B:
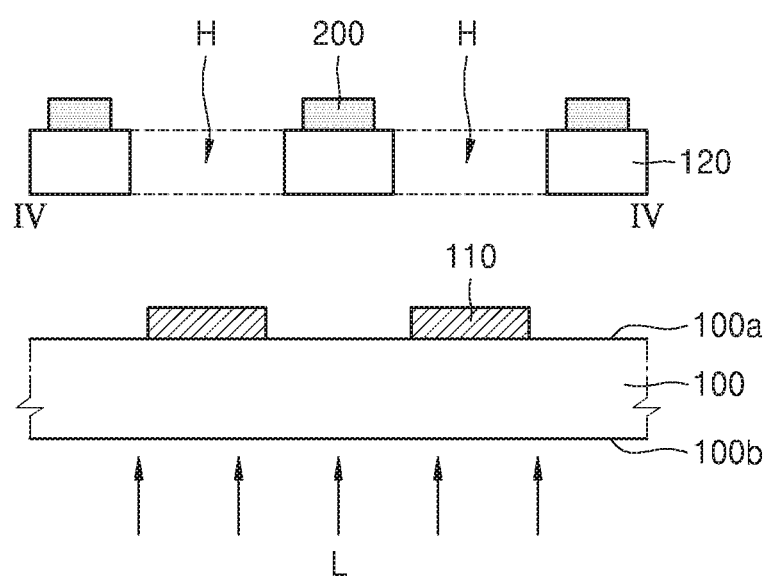

FIGS. 1A to 4B are plan views and cross-sectional views schematically illustrating a manufacturing process of a substrate for a display device, according to an embodiment of the present disclosure. FIG. 1B is a cross-sectional view taken along the line I-I of FIG. 1A, FIG. 2B is a cross-sectional view taken along the line II-II of FIG. 2A, FIG. 3B is a cross-sectional view taken along the line III-III of FIG. 3A, and FIG. 4B is a cross-sectional view taken along the line IV-IV of FIG. 4A.

A display device according to an embodiment of the present disclosure, which is a device for displaying an image, may be a liquid crystal display, an electrophoretic display, an organic light-emitting display, an inorganic light-emitting display, a field emission display, a surface-conduction electron-emitting display, a plasma display, or a cathode ray display.

Hereinafter, the display device according to an embodiment of the present disclosure will be described with reference to an organic light-emitting display device. However, the display device of the present disclosure is not limited thereto, and may be various display devices.

Figure 1B:
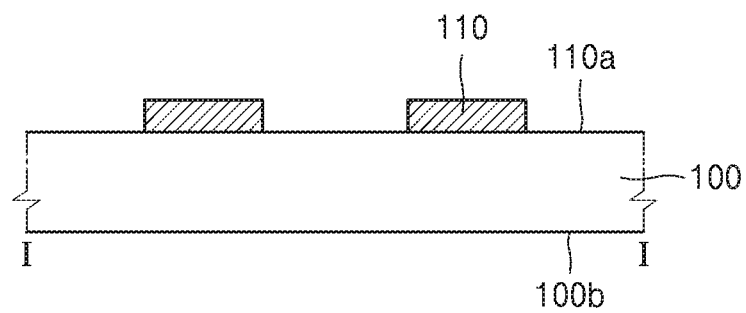

First, referring to FIGS. 1A and 1B, a blocking film 110 is formed on a supporting substrate 100. The supporting substrate 100 may have a first surface 100a and a second surface 100b, which are opposite to each other. In FIGS. 1A and 1B, the first surface 100a may refer to an upper surface of the supporting substrate 100, and the second surface 100b may refer to a lower surface of the supporting substrate 100. The blocking film 110 may be formed on the first surface 100a of the supporting substrate 100 on which a display unit is not formed. The supporting substrate 100 may be formed of a material having sufficient hardness and rigidity to support a substrate layer 120 (refer to FIG. 2B) to be described later and a display unit 200 formed on the substrate layer 120, for example, a glass material.

The blocking film 110 formed on the supporting substrate 100 may be patterned to have a specific shape as shown in FIG. 1A. FIG. 1A shows only one unit pixel which includes, for example, a red pixel, a green pixel and a blue pixel. The display device includes a plurality of unit pixels arranged in a matrix configuration along a low direction and a column direction. A substrate layer 120 to be described later which is disposed at least at an interface between the substrate layer 120 and the blocking film 110 may be removed. The substrate layer 120 which is disposed on the blocking film 110 may also be removed. Thus, the substrate layer 120 may not be formed at the portion where the blocking film 110 is formed, thereby obtaining the same effect as that of patterning the substrate layer 120 without performing an additional patterning process. As described above, the degree of freedom of the shape of the substrate layer 120 can be improved by forming the blocking film 110. Details thereof will be described later.

The blocking film 110 may be formed of a material capable of blocking the laser beam used in the process of detaching the substrate layer 120, which will be described later. In an embodiment, when laser beam having a wavelength of about 300 nm is used, a material which absorbs about 90% or more (or a transmittance of about 10% or less) laser beam may be used as the material. The blocking film 110 may include at least one selected from amorphous silicon (a-Si), poly-Si, crystalline-Si, ZnO, and IZO. In an embodiment, when an excimer laser beam having a wavelength of about 308 nm is used, amorphous silicon (a-Si) may be used as the blocking film 110.

The blocking film 110 is formed by first applying a material for forming the blocking film 110 onto the entire surface of the supporting substrate 100 and then patterning the applied material through exposure and development using a photoresist PR. The blocking film 110 shown in FIG. 1A has a substantially triangular shape. However, this shape is merely an example of the pattern shape of the blocking film 110, and the shape of the blocking film 110 can be freely modified depending on the shape of the substrate layer 120 to be patterned.

That is, in the method of manufacturing a display device according to an embodiment of the present disclosure, the blocking film 110 is formed on at least a portion of the supporting substrate 100 before the substrate layer 120 is formed on the supporting substrate 100. The portion where the blocking film is formed may be a portion to be removed from the display device after the final process. In other words, the portion where the blocking film 110 is formed may be understood as a portion where the substrate layer 120, which is a flexible substrate of the display device, is not formed. For example, referring to FIG. 1A to 4B, when a display device having a specific shape other than a rectangular shape is simply manufactured, the blocking film 110 may be formed at a portion where the substrate layer 120 does not need to be formed.

Then, referring to FIGS. 2A and 2B, a substrate layer 120 is formed on the blocking film 110. The substrate layer 120 may become a flexible substrate of a display device, and may include various materials having flexible or bendable characteristics. The substrate layer 120 may include, for example, a polymer resin such as polyethersulphone (PES), polyacrylate (PAR), polyetherimide (PEI), polyethylene napthalate (PEN), polyethylene terephalate (PET), polyphenylene sulfide (PPS), polyallylate, polyimide (PI), polycarbonate (PC), or cellulose acetate propionate (CAP).

The substrate layer 120 may be formed on the blocking film 110 to cover a part or all of the blocking film 110. As shown in FIG. 2B, the substrate layer 120 may cover a part or all of the blocking film 110, and may be in direct contact with at least a portion of the first surface 100a of the supporting substrate 100 on which the blocking film 110 is not formed. The substrate layer 120 may basically be formed over the entire surface of the supporting substrate 100.

In FIG. 2B, the blocking film 110 may have an upper surface 110a and a side surface 110b connected to the upper surface 110a, and, in this case, the side surface 110b may be understood as an edge 110e of the blocking film 110. The substrate layer 120 may be formed on the blocking film 110 to cover all of the upper surface 110a and side surface 110b of the blocking film 110.

Then, referring to FIGS. 3A and 3B, at least a portion of the substrate layer 120 formed on the supporting substrate 100 and at an interface between the blocking film 110 and the substrate layer 120 is removed to space the blocking film 110 and the substrate layer 120 apart from each other by a predetermined distance d. That is, the process of spacing the blocking film 110 and the substrate layer 120 apart from each other by a predetermined distance d may be understood as the process of removing a portion of the substrate layer 120 formed on the supporting substrate 100. The process of removing a portion of the substrate layer 120 may be performed using an etching method, and, in this case, wet etching or dry etching may be used. The process of removing a portion of the substrate layer 120 may be used without limitation as long as this process is a process capable of removing a portion of the substrate layer 120 according to the characteristics of the material constituting the substrate layer 120.

In the previous process of forming the substrate layer 120, at least a portion of the substrate layer 120 may be in contact with the blocking film 110, and other remaining parts thereof may be in contact with the supporting substrate 100. In such a process of forming the substrate layer 120 on the blocking film 110, the edge 110e of the blocking film 110 may be in contact with the substrate layer 120. As a comparative example, when the substrate layer 120 is separated from the supporting substrate 100 without removing at least a portion of the substrate layer 120 formed on the supporting substrate 100 at an interface between the blocking film 110 and the substrate layer 120, the end surface of the substrate layer 120 may be damaged at a portion where the substrate layer 120 is in contact with the blocking film 110. That is, since the substrate layer 120 can be torn and separated from a portion where the substrate layer 120 is in direct contact with the supporting substrate 100, there may be a problem in that the edge of a flexible substrate formed by the substrate layer 120 is not smoothly formed.

Thus, in the method of manufacturing a display device according to an embodiment of the present disclosure, the blocking film 110 and the substrate layer 120 may be spaced apart from each other by a predetermined distance d by removing at least a portion of the substrate layer 120 formed at an interface between the blocking film 110 and the substrate layer 120. Through this removal process, the edge 110e of the blocking film 110 and the edge 120e of the substrate layer 120 may be spaced apart from each other by a predetermined distance d.

Meanwhile, in the aforementioned process of FIGS. 2A and 2B, the substrate layer 120 is formed on the supporting substrate 100 to cover the blocking film 110. Therefore, at least a portion of the substrate layer 120 is located on the blocking film 110, and the other part thereof is located on the supporting substrate 100. Referring to FIG. 3B, in the process of removing at least a portion of the substrate layer 120, the substrate layer 120 formed on the barrier layer 110 may also be removed together with the at least portion of the substrate layer 120. In this case, the substrate layer 120 may be located only on the first surface 100a of the supporting substrate 100 after the process of spacing the blocking film 110 and the substrate layer 120 apart from each other by a predetermined distance d.

Referring to FIG. 3C as another embodiment, unlike the embodiment of FIG. 3B, in the process of removing at least a portion of the substrate layer 120, the substrate layer 120 formed on the blocking film 110 may not be removed. That is, in this embodiment, at least a portion of the substrate layer 120 is removed from a portion contacting the edge 110e of the blocking film 110, so that the blocking film 110 and the substrate layer 120 are spaced apart from each other by a predetermined distance d, and a portion 120a of the substrate layer 120 may remain on the blocking film 110. The portion 120a of the substrate layer 120, remained on the blocking film 110, may be understood as a dummy portion, and may remain on the supporting substrate 100 even after the process of manufacturing a display device is completed.

Referring to FIG. 2B again, the blocking film 110 has an upper surface 110a and a side surface 110b connected to the upper surface 110a, and, in this case, the side surface 110b may be understood as an edge 110e of the blocking film 110. The substrate layer 120 may be formed on the blocking film 110 so as to cover all of the upper surface 110a and side surface 110b of the blocking film 110. Subsequently, referring to FIG. 3B or 3C, a portion of the substrate layer 120, contacting the side surface 110b of the blocking film 110, may be removed, and a portion of the substrate layer 120, contacting the upper surface 110a of the blocking film 110, may not be removed, may be partially removed, or may be entirely removed, if necessary.

Then, referring to FIGS. 4A and 4B, a display unit 200 is formed on the substrate layer 120. The display unit 200 may include a pixel P, a thin film transistor (not shown) connected to the pixel P, a capacitor (not shown), and various wirings PL, and may include various organic films, inorganic films and metal films for forming these components. The display unit 200 may be formed on the substrate layer 120.

As shown in FIG. 4A, a plurality of pixels P may be disposed in the central portion 120c of the patterned substrate layer 120. A plurality of sub-pixels SP may be included in the pixel P, and each sub-pixel SP may be one of R, G, and B. In another embodiment, W may be included as the sub-pixel SP. Although it is shown in FIG. 4A that four sub-pixels SP are disposed, the position and number of the sub-pixels SP may be variously modified.

Meanwhile, although it is shown in FIG. 4A that only one pixel P is disposed, it is possible to implement a flexible display device or a stretchable display device by repeating such a structure. That is, in the case of a display device in which the pixel structure of FIG. 4A is repeatedly provided, a portion where the blocking film 110 has been formed may be a hole H penetrating the substrate layer 120. Through this structure, a flexible display device or a stretchable display device can be easily manufactured.

Meanwhile, although it is illustrated in this embodiment that the display unit 200 is formed only on the substrate layer 120, in another embodiment, some elements or films may be formed on the blocking film 110 or on an area where the blocking film 110 and the substrate layer 120 are spaced apart from each other in the process of forming the display unit 200. In this case, some elements or films formed on the area where the blocking film 110 and the substrate layer 120 are spaced apart from each other may be removed before performing a process of separating the substrate layer 120 from the supporting substrate 110.

Then, a process of separating the substrate layer 120 from the supporting substrate 100 is performed. FIG. 4B schematically illustrates a process of separating the substrate layer 120 from the supporting substrate 100, and FIG. 4A illustrates the substrate 120 separated from the supporting substrate 100, that is, a flexible substrate FS in the display device. For convenience of explanation, although it is shown in FIGS. 4A and 4B that only the substrate layer 120 is formed on the supporting substrate 100, light-emitting elements, transistors electrically connected to the light-emitting elements, capacitors, and various wirings may also be further formed on the substrate layer 120.

Referring to FIG. 4B, the substrate layer 120 and the supporting substrate 100 may be separated from each other by a laser beam desorption method (laser beam release) for irradiating the substrate layer 120 with a laser beam L.

The laser beam L may be applied from the second surface 100b of the supporting substrate 100 toward a surface where the first surface 100a of the supporting substrate 100 is in contact with the substrate layer 120. As the laser beam L, for example, an excimer laser beam having a wavelength of about 308 nm or a solid UV laser beam having a wavelength of about 343 nm or about 355 nm may be used. In the irradiation with the laser beam L, a linear laser apparatus may be used, but the present disclosure is not limited thereto.

The substrate layer 120 separated from the supporting substrate 100 may be implemented in various shapes as needed, as shown in FIG. 4A. In the method of manufacturing a substrate for a display device according to this embodiment, first, the blocking film 110 is formed on the supporting substrate 100, and then the substrate layer 120 having various shapes, that is, a flexible substrate, may be freely implemented through a method of forming the substrate layer 120 to cover the blocking film 110. Further, in this embodiment, in order to solve the problem of damaging the substrate layer 120 at a portion where the substrate layer 120 and the blocking film 110 are in contact with each other in the process of separating the substrate layer 120 from the supporting substrate 100, the portion where the substrate layer 120 and edges of the blocking film 110 are in contact with each other is removed, thereby easily separating the substrate layer 120 from the supporting substrate 100 without damage.

Although only the method of manufacturing a substrate for a display device has been described heretofore, the present disclosure is not limited thereto. For example, a method of manufacturing a display device using the substrate formed by this manufacturing method may also belong to the scope of the present disclosure.

Figure 5A:
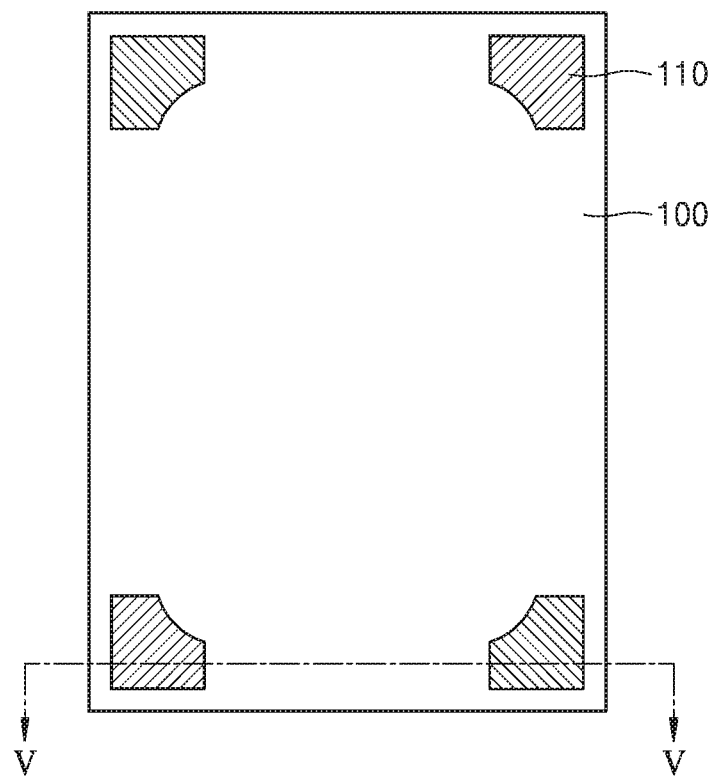
FIGS. 5A and 5B are a plan view and a cross-sectional view schematically illustrating a manufacturing process of a substrate for a display device, according to another embodiment of the present disclosure.

FIGS. 5A to 14 are plan views and cross-sectional views schematically illustrating a manufacturing process of a substrate for a display device, according to another embodiment of the present disclosure. FIG. 5B is a cross-sectional view taken along the line V-V of FIG. 5A, FIG. 6B is a cross-sectional view taken along the line VI-VI of FIG. 6A, and FIG. 7B is a cross-sectional view taken along the line VII-VII of FIG. 7A.

Referring to FIGS. 5A to 7B, similarly to the aforementioned embodiment, a desired shape of the substrate layer 120 may be obtained by forming the blocking film 110 on the supporting substrate 100 before forming the substrate layer 120. In this embodiment, a process of manufacturing a display device having substantially flexible characteristics using the same process as the aforementioned embodiment will be described. In this embodiment, a display device having a main area MA and four side areas EA1, EA2, EA3, and EA4 will be described as an example.

Figure 5B:
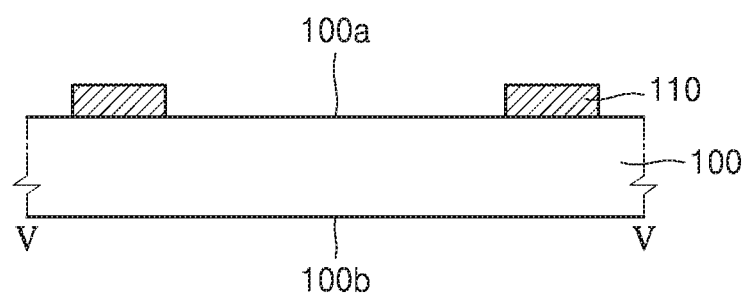

First, referring to FIGS. 5A and 5B, a blocking film 110 is formed on a supporting substrate 100. The supporting substrate 100 may have a first surface 100a and a second surface 100b, which are opposite to each other. In FIGS. 5A and 5B, the first surface 100a may refer to an upper surface of the supporting substrate 100, and the second surface 100b may refer to a lower surface of the supporting substrate 100. The blocking film 110 may be formed on the first surface 100a of the supporting substrate 100. The supporting substrate 100 may be formed of a material having sufficient hardness and rigidity to support the blocking film 110 and a substrate layer 120 to be described later, for example, a glass material.

The blocking film 110 formed on the supporting substrate 100 may be patterned to have a specific shape as shown in FIG. 5A. A substrate layer 120 to be described later which is disposed at least at an interface between the substrate layer 120 and the blocking film 110 may be removed. The substrate layer 120 to be described later which is disposed on the blocking film 110 may also be removed. Thus, the substrate layer 120 may not be formed at the portion where the blocking film 110 is formed, thereby obtaining the same effect as that of patterning the substrate layer 120 without performing an additional patterning process. As described above, the degree of freedom of the shape of the substrate layer 120 can be improved by forming the blocking film 110.

In this embodiment, as described above, in implementing a side display device, the blocking film 110 may be formed in an unnecessary region, that is, a region where a flexible substrate need not be formed, at each corner. That is, the portion where the blocking film 110 is formed may be a portion to be removed or a portion required to be removed in the display device after the final process. As in this embodiment, in the case of simply manufacturing a display device having a specific shape other than a rectangular shape, when a portion where the substrate layer 120 need not be formed, for example, a hole penetrating a flexible substrate itself is formed, or when the blocking film has a shape in which corners are cut, the blocking film 110 may be formed at the corresponding position.

The blocking film 110 may be formed of a material capable of blocking the laser beam used in the process of detaching the substrate layer 120 from the supporting substrate 100. In an embodiment, when a laser beam having a wavelength of 300 nm is used to detach the substrate layer 120 from the supporting substrate 100, a material which absorbs about 90% or more (or a transmittance of about 10% or less) laser beam may be used as the material. The blocking film 110 may include at least one selected from amorphous silicon (a-Si), poly-Si, crystalline-Si, ZnO, and IZO. In an embodiment, when an excimer laser beam having a wavelength of about 308 nm is used, amorphous silicon (a-Si) may be used.

Figure 6A:
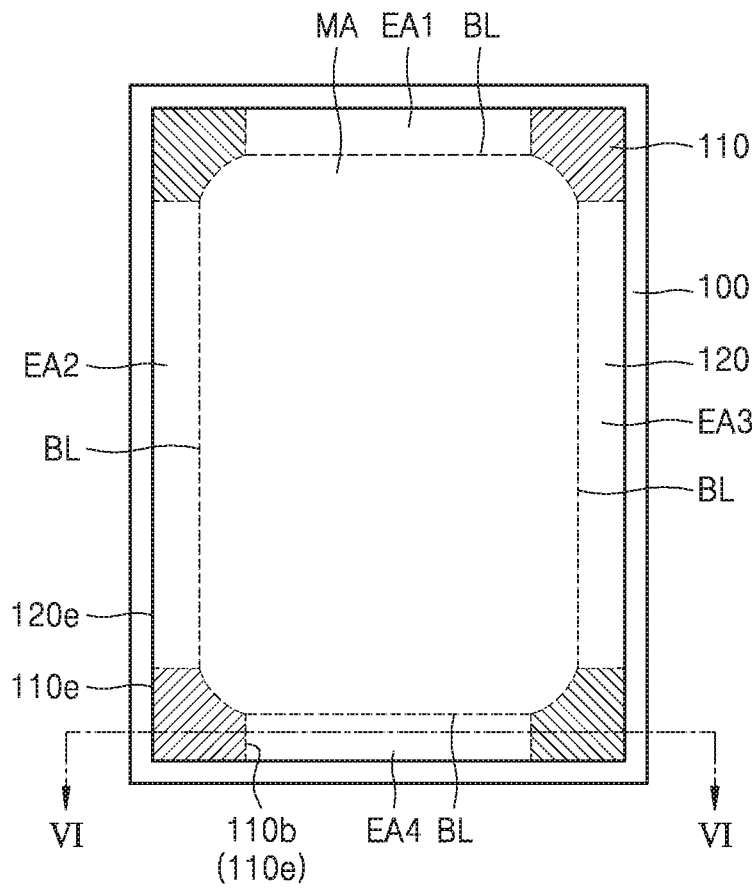
FIGS. 6A and 6B are a plan view and a cross-sectional view schematically illustrating a manufacturing process of a substrate for a display device, according to another embodiment of the present disclosure.
Figure 6B:
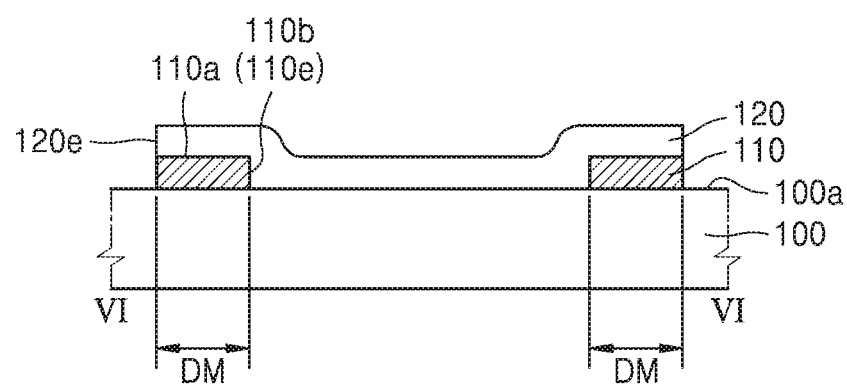

Then, referring to FIGS. 6A and 6B, a substrate layer 120 is formed on the blocking film 110. The substrate layer 120 may be formed on the blocking film 110 to cover a part or all of the blocking film 110. As shown in FIG. 6B, the blocking film 110 may have an upper surface 110a and a side surface 110b, and the side surface 110b may be understood as an edge 110e of the blocking film 110. The substrate layer 120 may be formed to be in contact with at least a portion of the side surface of the blocking film 110, and may be formed to cover at least a portion of the upper surface 110a of the blocking film 110.

As shown in FIG. 6B, the substrate layer 120 may be formed to cover the blocking film 110 and to be in direct contact with at least a portion of the first surface 100a of the supporting substrate 100 on which the blocking film 110 is formed. The substrate layer 120 may be basically formed over the entire surface of the supporting substrate 100, but may also be formed except for the outermost portion of the supporting substrate 100 as shown in FIG. 6A. For convenience of explanation, it is shown in FIG. 6A that the substrate layer 120 is formed except for the outermost portion of the supporting substrate 100.

The substrate layer 120 is formed on the entire surface of the supporting substrate 100, and a portion of the substrate layer 120 is disposed to overlap the blocking film 110. As described above, the portion of the substrate layer 120, overlapping the blocking film 110, may be understood as a dummy portion DM which is a portion not formed into a display panel constituting the display device. Therefore, only a portion except for the portion overlapping the blocking film 110 is formed into a flexible substrate. In this embodiment, the substrate layer 120 to be a flexible substrate may include a main area MA, and a first side area EA1, a second side area EA2, a third side area EA3, and a fourth side area EA4, which extend from the main area MA. The first to fourth side areas EA1, EA2, EA3, and EA4 may be disposed on the side surfaces of the main area MA, and may be bent or curved along bending lines BL directly contacting the main area MA.

Figure 7A:
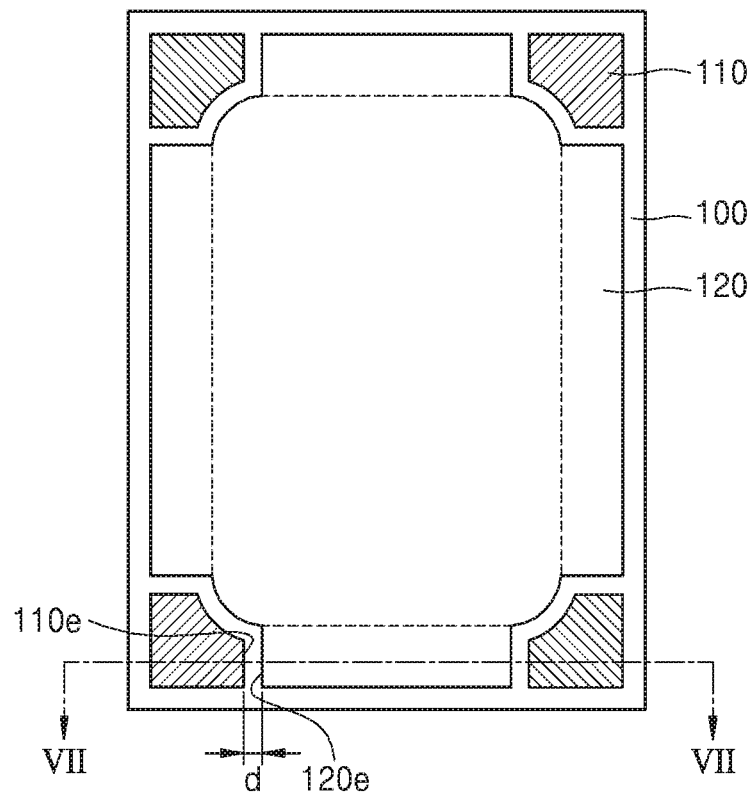
FIGS. 7A and 7B are a plan view and a cross-sectional view schematically illustrating a manufacturing process of a substrate for a display device, according to another embodiment of the present disclosure.
Figure 7B:
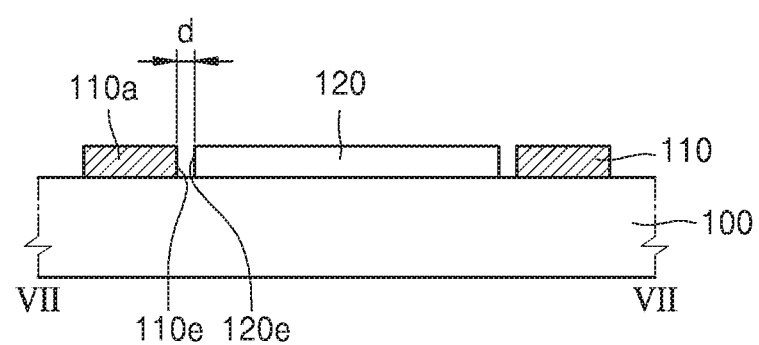

Then, referring to FIGS. 7A and 7B, at least a portion of the substrate layer 120 formed on the supporting substrate 100 is removed to space the blocking film 110 and the substrate layer 120 apart from each other by a predetermined distance d. That is, the process of spacing the blocking film 110 and the substrate layer 120 apart from each other by a predetermined distance d may be understood as the process of removing a portion of the substrate layer 120 formed on the supporting substrate 100 and at an interface between the blocking film and the substrate layer 120. The process of removing a portion of the substrate layer 120 may be performed using an etching method, and, in this case, wet etching or dry etching may be used. This process of removing a portion of the substrate layer 120 may be used without limitation as long as this process is a process capable of removing a portion of the substrate layer 120 according to the characteristics of the material constituting the substrate layer 120.

In the previous process of forming the substrate layer 120, at least a portion of the substrate layer 120 may be in contact with the blocking film 110, and other remaining part thereof may be in contact with the supporting substrate 100. In such a process of forming the substrate layer 120 on the blocking film 110, the edge 110e of the blocking film 110 may be in contact with the substrate layer 120. As a comparative example, when the substrate layer 120 is separated from the supporting substrate 100 without removing at least a portion of the substrate layer 120 formed on the supporting substrate 100 and at an interface between the blocking film 110 and the substrate layer 120, the end surface of the substrate layer 120 may be damaged at a portion where the substrate layer 120 is in contact with the blocking film 110. That is, since the substrate layer 120 can be torn and separated from a portion where the substrate layer 120 is in direct contact with the supporting substrate 100, there may be a problem in that the edge of a flexible substrate formed by the substrate layer 120 is not smoothly formed.

Thus, in the method of manufacturing a display device according to an embodiment of the present disclosure, the blocking film 110 and the substrate layer 120 may be spaced apart from each other by a predetermined distance d by removing at least a portion of the substrate layer 120 formed and at an interface between the blocking film 110 and the substrate layer 120. Through this removal process, the edge 110e of the blocking film 110 and the edge 120e of the substrate layer 120 may be spaced apart from each other by a predetermined distance d.

Meanwhile, in the aforementioned process, the substrate layer 120 is formed on the supporting substrate 100 so as to cover the blocking film 110. Therefore, at least a portion of the substrate layer 120 is located on the blocking film 110, and the other part thereof is located on the supporting substrate 100. As another embodiment, in the process of removing at least a portion of the substrate layer 120, the substrate layer 120 formed on the blocking film 110 may also be removed together. In this case, the substrate layer 120 may be located only on the first surface 100a of the supporting substrate 100 after the process of spacing the blocking film 110 and the substrate layer 120 apart from each other by a predetermined distance d.

As another embodiment, in the process of removing at least a portion of the substrate layer 120, the substrate layer 120 formed on the blocking film 110 may not be removed. That is, at least a portion of the substrate layer 120 is removed from a portion contacting the edge 110e of the blocking film 110, so that the blocking film 110 and the substrate layer 120 are spaced apart from each other by a predetermined distance d, and a portion of the substrate layer 120 may remain on the blocking film 110. The portion of the substrate layer 120, remaining on the blocking film 110, may be understood as a dummy portion regardless of a display device and a flexible substrate forming the display device, and may remain on the supporting substrate 100 even after the process of manufacturing a display device is completed.

Referring to FIG. 6B again, the blocking film 110 has an upper surface 110a and a side surface 110b connected to the upper surface 110a, and, in this case, the side surface 110b may be understood as an edge 110a of the blocking film 110. The substrate layer 120 may be formed on the blocking film 110 so as to cover all of the upper surface 110a and side surface 110b of the blocking film 110. Subsequently, referring to FIG. 7B, a portion of the substrate layer 120, contacting the side surface 110b of the blocking film 110, may be removed, and a portion of the substrate layer 120, contacting the upper surface 110a of the blocking film 110, may not be removed, may be partially removed, or may be entirely removed, if necessary.

Figure 10:
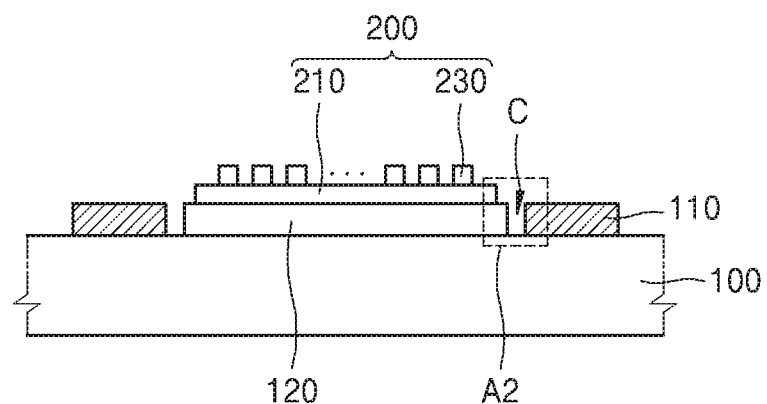
FIG. 10 is a cross-sectional view schematically illustrating a manufacturing process of a substrate for a display device, according to another embodiment of the present disclosure.
Figure 11:
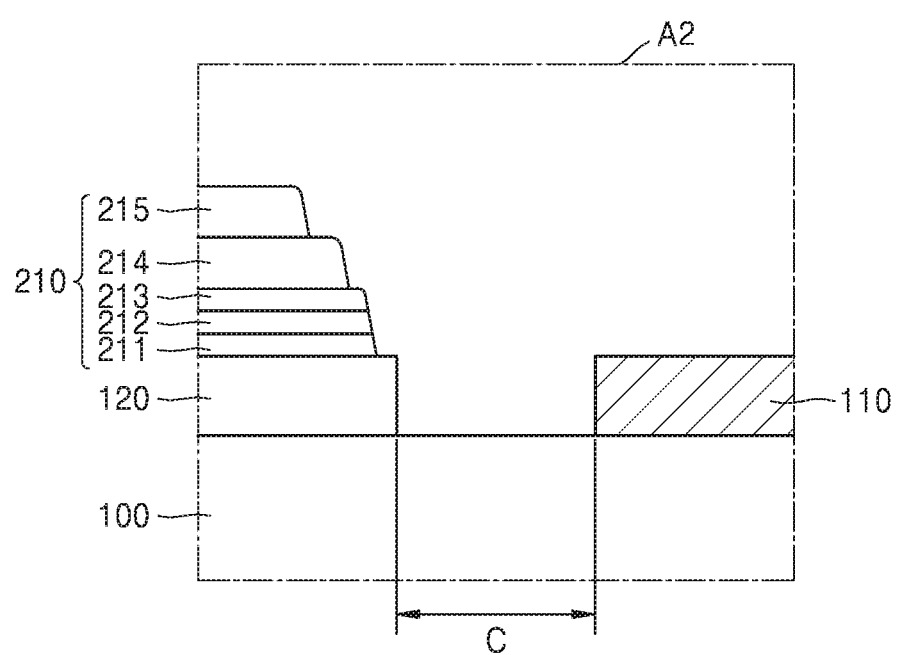
FIG. 11 is an enlarged cross-sectional view of the portion A2 in FIG. 10.
Figure 12:
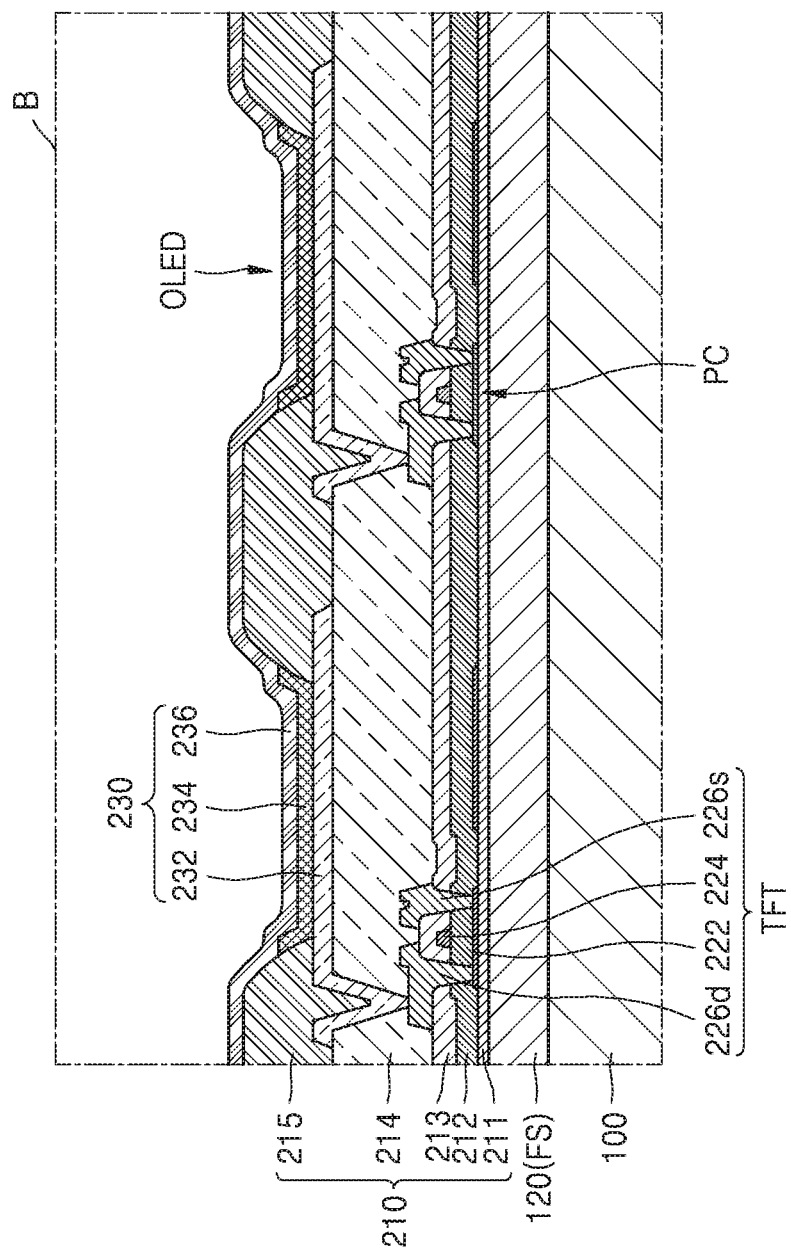
FIG. 12 is a cross-sectional view schematically illustrating a manufacturing process of a substrate for a display device, according to another embodiment of the present disclosure.

Subsequently, a description will be given with reference to FIGS. 8 to 14. FIG. 9 is an enlarged cross-sectional view of the portion A1 in FIG. 8, FIG. 11 is an enlarged cross-sectional view of the portion A2 in FIG. 10, and FIG. 12 is an enlarged cross-sectional view of the portion B in FIG. 12.

Figure 8:
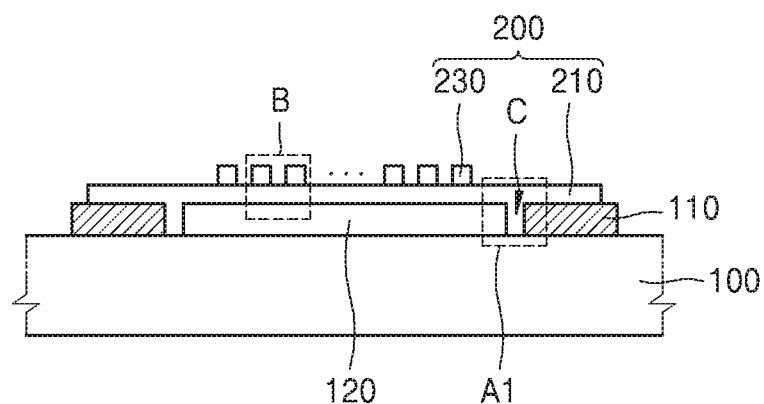
FIG. 8 is a cross-sectional view schematically illustrating a manufacturing process of a substrate for a display device, according to another embodiment of the present disclosure.
Figure 9:
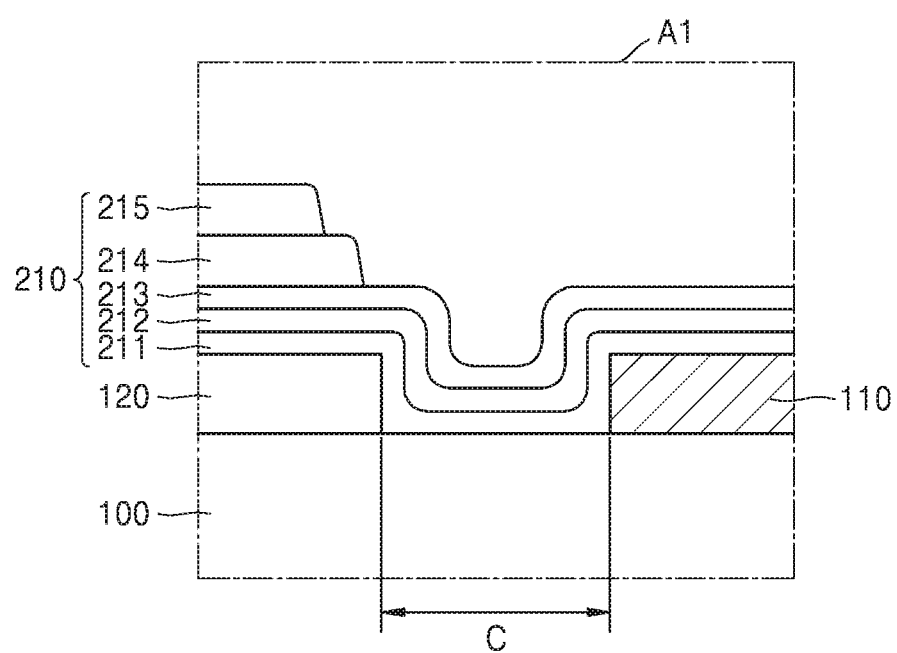
FIG. 9 is an enlarged cross-sectional view of the portion A1 in FIG. 8.

Then, referring to FIGS. 8 and 9, a display unit 200 is formed on the substrate layer 120. The display unit 200 may include a pixel 200 including a pixel circuit PC (refer to FIG. 12), and a light-emitting element 230 electrically connected to the pixel circuit 210 which corresponds to PC in FIG. 12. Details of the pixel circuit 210 and the light-emitting element 230 will be described with reference to FIG. 12.

Subsequently, referring to FIG. 8, although not shown in the drawing, the pixel circuit 210 may have a multi-layered structure in which a plurality of layers is laminated. The plurality of layers is sequentially laminated, and patterned if necessary, thereby forming the pixel circuit 210. The pixel circuit 210 may include films, such as inorganic films, organic films, and metal films, which includes various materials.

In this case, some of the films constituting the pixel circuit 210 may be formed together even on the spacing region of the supporting substrate 100 exposed by removing a portion of the substrate layer 120. Some of the films constituting the pixel circuit 210 may be formed on the entire surface of the supporting substrate 100.

Referring to FIG. 9 in which the portion A1 of FIG. 8 is enlarged, inorganic films 211, 212, and 213 may be disposed on the spacing region C between the substrate layer 120 and the blocking film 110. The inorganic films 211, 212, and 213 are, for example, a buffer layer 211, a gate insulating film 212, and an interlayer insulating film 213, which will be described later. The inorganic films 211, 212, and 213 are formed on the substrate layer 120, but may be formed to extend to the spacing region C and the blocking film 110. Of course, these inorganic films 211, 212, and 213 are formed during the manufacturing process, and the portions of the inorganic films 211, 212, and 213, formed on the spacing region C and the blocking film 110, are removed in the final process. As such, the inorganic films 211, 212, and 213 may be formed on the entire surface of the supporting substrate 100 without a separate removal process.

Meanwhile, organic films 214 and 215 may be formed on the inorganic films 211, 212, and 213. The organic films 214 and 215, unlike the inorganic films 211, 212, and 213, may not be formed on the spacing region C.

Then, referring to FIG. 10 and FIG. 11 in which the portion A2 of FIG. 10 is enlarged, the inorganic films 211, 212, and 213 formed on the spacing region C are removed. When the substrate layer 120 is separated from the supporting substrate 100 without removing the inorganic films 211, 212, and 213 formed on the spacing region C, there may occur a problem that cracks are generated in the inorganic films 211, 212, and 213 formed on the spacing region C, and are propagated to the display unit 200 to damage the display unit 200. In order to solve this problem, a process of removing the inorganic films 211, 212, and 213 formed on the spacing region C may be performed before separating the substrate layer 120 from the supporting substrate 100.

The process of removing at least a portion of the inorganic films 211, 212, and 213 may be performed using an etching method, and, in this case, wet etching or dry etching may be used, but the present disclosure is not limited thereto. Further, in an embodiment, the inorganic films 211, 212, and 213 may be simultaneously removed. That is, the inorganic films 211, 212, and 213 may be removed by batch etching. In another embodiment, the inorganic films 211, 212, and 213 may be separately removed. As such, the inorganic films 211, 212, and 213 may be removed by a separate process, and may also be simultaneously removed during the process of forming a contact hole in the process of forming the pixel circuit 210. In order to remove the inorganic films 211, 212, and 213 without additional processes, it is preferable that the inorganic films 211, 212, and 213 are simultaneously removed in the process of forming the pixel circuit 210.

Meanwhile, FIG. 12 is an enlarged cross-sectional view of the portion B of FIG. 8. FIG. 12 illustrates a structure of the display unit 200 formed on the substrate layer 120.

The display unit 200 according to this embodiment may include a pixel circuit 210 formed on the substrate layer 120 and a light-emitting element 230 electrically connected to the pixel circuit 210. The pixel circuit 210 may include a thin film transistor TFT, a capacitor (not shown), and wirings. Although FIG. 12 illustrates an organic light-emitting element as the light-emitting element 230, the light-emitting element 230 according to the present disclosure is not limited thereto. The light-emitting element 230 may be an inorganic light-emitting element or a liquid crystal element.

In an embodiment, the substrate layer 120 may be a flexible substrate FS. The substrate layer 120 has flexible characteristics, and may be formed of a metal material or plastic material having excellent heat resistance and durability. Examples of the plastic material may include polyethylene terephthalate (PET), polyethylene naphthalate (PEN), polyimide (PI), polyethersulfone (PES), polyacrylate (PA), polyetherimide (PEI), polyphenylene sulfide (PPS), polyarylate (PAR), polycarbonate (PC), cellulose triacetate, cellulose acetate propionate (CAP), and polyaryleneether sulfone.

In order to planarize the surface of the substrate layer 120 or prevent impurities from penetrating into a semiconductor layer 222 of the thin film transistor TFT, a buffer layer 211 made of silicon oxide or silicon nitride may be disposed on the substrate layer 120, and the semiconductor layer 222 may be disposed on the buffer layer 211.

A gate electrode 224 is disposed on the semiconductor layer 222. A source electrode 226s and a drain electrode 226d electrically communicate with each other according to a signal applied to the gate electrode 224. The gate electrode 224 may be formed as a single layer or a multi-layer including one or more selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of adhesion to adjacent layer, surface flatness of layers to be laminated, and process ability.

In this case, in order to secure the insulation between the semiconductor layer 222 and the gate electrode 224, a gate insulating film 212, which is an inorganic insulating film made of silicon oxide and/or silicon nitride, may be interposed between the semiconductor layer 222 and the gate electrode 224.

An interlayer insulating film 213 may be disposed on the gate electrode 224, and the interlayer insulating film 213 may be an inorganic insulating film. For example, the interlayer insulating film 213 may be formed as a single layer or a multi-layer including silicon oxide or silicon nitride.

A source electrode 226s and a drain electrode 226d are disposed on the interlayer insulating film 213. Each of the source electrode 226s and the drain electrode 226d is electrically connected to the semiconductor layer 222 through a contact hole formed in the interlayer insulating film 213 and the gate insulating film 212. Each of the source electrode 226s and the drain electrode 226d may be formed as a single layer or a multi-layer including one or more selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of conductivity or the like.

Meanwhile, although not shown in the drawing, in order to protect the thin film transistor TFT having such a structure, a protective film (not shown) covering the thin film transistor TFT may be disposed. The protective film may be formed of an inorganic material such as silicon oxide, silicon nitride, or silicon oxynitride.

Meanwhile, a via layer 214 may be disposed on the thin film transistor TFT. In this case, the via layer 214 may be a planarization film or a protective film. The via layer 214 serves to planarize the upper surface of the thin film transistor TFT and protect the thin film transistor TFT and various elements when the light-emitting element 230 is disposed on the thin film transistor TFT. The via layer 214 may be formed of an acrylic organic material, benzocyclobutene (BCB), or the like.

In this case, as shown in FIG. 12, the buffer layer 211, the gate insulating film 212, the interlayer insulating film 213, and the via layer 214 may be formed on the entire surface of the substrate layer 120.

Meanwhile, a pixel defining film 215 may be disposed over the thin film transistor TFT. The pixel defining film 215 may be disposed on the via layer 214, and may have an opening for defining a pixel region. The pixel defining film 215 may be disposed to expose the central portion of a pixel electrode 232 to be described later and cover the edge thereof.

The pixel defining film 215 may be formed as, for example, an organic insulating film. Such an organic insulating film may include an acrylic polymer such as polymethyl methacrylate (PMMA), polystyrene (PS), a polymer derivative having a phenol group, an imide-based polymer, an arylether-based polymer, an amide-based polymer, a fluorine-based polymer, a para-xylene-based polymer, a vinylalcohol-based polymer, or a mixture thereof.

Meanwhile, a light-emitting element 230 may be disposed on the pixel defining film 215. The light-emitting element 230 may include a pixel electrode 232, an intermediate layer 234 including an emission layer (EML), and a counter electrode 236.

The pixel electrode 232 may be a (semi)transparent electrode or a reflective electrode. When the pixel electrode 232 is a (semi)transparent electrode, it may formed of ITO, IZO, ZnO, $In_2O_3$, IGO, or AZO. When the pixel electrode 232 is a reflective film, it may have a reflective film formed of Ag, Mg, Al, Pt, Pd, Au, Ni, Nd, Ir, Cr, or a compound thereof, and a layer formed of ITO, IZO, ZnO, $In_2O_3$, IGO, or AZO. Of course, the present disclosure is not limited thereto, and the pixel electrode 232 may be formed of various materials, and the structure thereof may also be modified in various forms such as a single layer and a multi-layer.

The intermediate layer 234 may be disposed in the pixel region defined by the pixel defining film 215. This intermediate layer 234 may include an emission layer (EML) emitting light in response to an electrical signal, and may have a single or multiple structure where a hole injection layer (HIL) and a hole transport layer (HTL), which are disposed between the emission layer (EML) and the pixel electrode 232, and an electron transport layer (ETL) and an electron injection layer (EIL), which are disposed between the emission layer (EML) and the counter electrode 236, are laminated. Of course, the intermediate layer 234 is not limited thereto, and may have various structures.

The counter electrode 236 covering the intermediate layer 234 including the emission layer (EML) and facing the pixel electrode 232 may be disposed over the entire surface of the substrate layer 120. The counter electrode 236 may be a (semi)transparent electrode or a reflective electrode. When the counter electrode 236 is a (semi)transparent electrode, it may have a layer formed of a metal having a small work function such as Li, Ca, LiF/Ca, LiF/Al, Al, Ag, or Mg, or a compound thereof, and a (semi)transparent conductive layer formed of ITO, IZO, ZnO, or $In_2O_3$. When the counter electrode 236 is a reflective electrode, it may have a layer formed of Li, Ca, LiF/Ca, LiF/Al, Al, Ag, Mg, or a compound thereof. Of course, the structure and material of the counter electrode 236 are not limited thereto, and may be modified in various forms.

Figure 13:
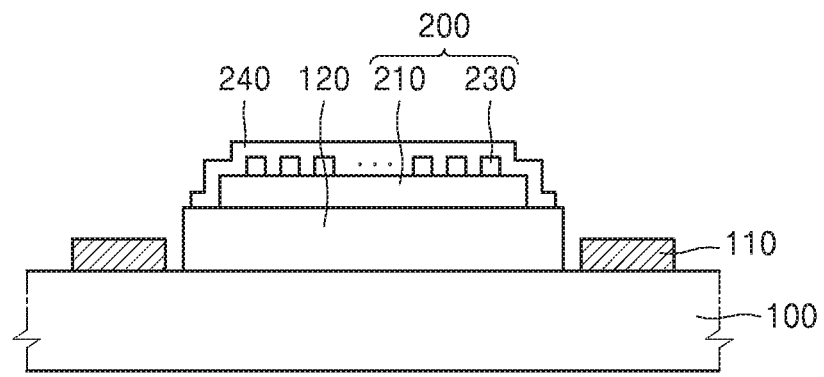
FIG. 13 is a cross-sectional view schematically illustrating a manufacturing process of a substrate for a display device, according to another embodiment of the present disclosure.
Figure 14:
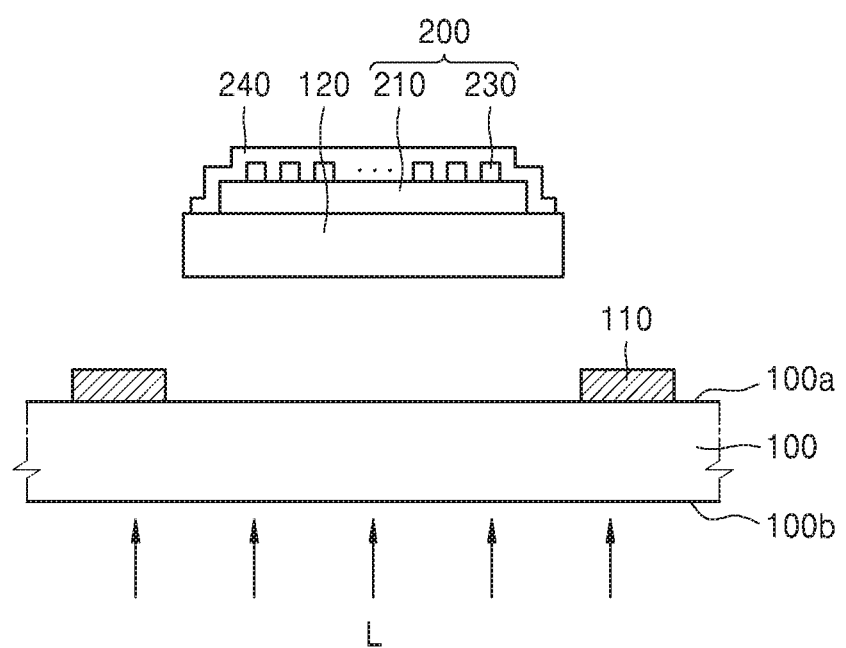
FIG. 14 is a cross-sectional view schematically illustrating a manufacturing process of a substrate for a display device, according to another embodiment of the present disclosure.

Referring to FIGS. 13 and 14, first, as shown in FIG. 13, a sealing layer 240 may be formed on the substrate layer 120 to cover the light emitting element. The sealing layer 240 may be a composite film of an inorganic film and an organic film, although not shown in the drawing. The sealing layer 240 serves to protect the display unit 200 from ambient air and impurities.

Then, as shown in FIG. 14, a process of separating the substrate layer 120 from the supporting substrate 100 is performed. In an embodiment, the substrate layer 120 and the supporting substrate 100 may be separated from each other by a laser beam desorption method (laser beam release) for irradiating the substrate layer 120 with a laser beam L. The laser beam L may be applied from the second surface 100b of the supporting substrate 100 toward a surface where the first surface 100a of the supporting substrate 100 is in contact with the substrate layer 120. As the laser beam L, for example, an excimer laser beam having a wavelength of about 308 nm or a solid UV laser beam having a wavelength of about 343 nm or about 355 nm may be used. In the irradiation with the laser beam L, a linear laser apparatus may be used, but the present disclosure is not limited thereto.

In order to implement a next-generation display such as a stretchable display or an edge display, a design different from that of a conventional display device is required in the internal structure as well as in the entire shape of a panel. For this purpose, a technology of increasing the degree of freedom of the mechanical deformation and shape of a display panel is necessarily required. However, such a modification of the design has limitations in a conventional manufacturing method of a substrate. Particularly, in the case of a flexible display device having a display area even at a side surface thereof, in addition to the existing processes, additional processes such as film cutting are required to form the overall shape of the display panel. Further, in the case of a stretchable display device, as a result of the formation of an elongated pixel structure, a dummy region which is not functionally operated is formed. In the conventional manufacturing process, it is impossible to selectively remove the dummy region.

Thus, in the method of manufacturing a substrate for a display device and the method of manufacturing a display device, the above problems can be remarkably solved without additional processes by detaching only a desired region in the process of detaching a flexible substrate, that is, the substrate layer.

As described above, according to one or more embodiments, there can be provided a method of manufacturing a substrate for a display device, by which various substrate shapes can be easily implemented, and a method of manufacturing a display device.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. A method of manufacturing a substrate for a display device, the method comprising:
   preparing a supporting substrate having a first surface and a second surface opposite to the first surface;
   forming a blocking film on the first surface of the supporting substrate;
   forming a substrate layer on the supporting substrate to cover the blocking film;
   removing at least a portion of the substrate layer to space the blocking film apart from the substrate layer by a predetermined distance; and
   separating the substrate layer from the supporting substrate.

2. The method of claim 1,
   wherein, in the forming of the substrate layer, at least a portion of the substrate layer is in contact with the blocking film, and a remaining part thereof is in contact with the supporting substrate.

3. The method of claim 1,
   wherein the blocking film includes at least one of amorphous silicon (a-Si), poly-Si, crystalline-Si, ZnO, and IZO.

4. The method of claim 1,
   wherein the blocking film includes a material which absorbs about 90% or more laser beam having a wavelength of about 300 nm.

5. The method of claim 1,
   wherein the removing at least a portion of the substrate layer comprises etching at least a portion of the substrate layer.

6. The method of claim 1,
wherein, in the removing at least a portion of the substrate layer, at least a portion of the substrate layer disposed at an interface between the blocking film and the substrate layer is removed.

7. The method of claim 1,
wherein, in the separating of the substrate layer, the substrate layer is separated from the supporting substrate by irradiating the second surface of the supporting substrate with a laser beam.

8. The method of claim 7,
wherein, in the separating of the substrate layer, the blocking film is not separated from the supporting substrate when the substrate layer is separated from the supporting substrate.

9. The method of claim 1,
wherein the substrate layer is a flexible substrate.

10. A method of manufacturing a display device, the method comprising:
preparing a supporting substrate having a first surface and a second surface opposite to the first surface;
patterning a blocking film on the first surface of the supporting substrate;
forming a substrate layer on the supporting substrate to cover the blocking film;
removing at least a portion of the substrate layer to space the blocking film apart from the substrate layer by a predetermined distance;
forming a display unit on the substrate layer, the display unit including a pixel; and
separating the substrate layer from the supporting substrate.

11. The method of claim 10, further comprising:
forming a sealing layer on the display unit, wherein the sealing layer externally seals the display unit.

12. The method of claim 10,
wherein, in the forming of the substrate layer, at least a portion of the substrate layer is in contact with the blocking film, and a remaining part thereof is in contact with the supporting substrate.

13. The method of claim 10,
wherein the blocking film includes at least one of amorphous silicon (a-Si), poly-Si, crystalline-Si, ZnO, and IZO.

14. The method of claim 10,
wherein the blocking film includes a material which absorbs about 90% or more laser beam having a wavelength of about 300 nm.

15. The method of claim 10,
wherein the removing at least a portion of the substrate layer includes etching at least a portion of the substrate layer.

16. The method of claim 10,
wherein, in the removing at least a portion of the substrate layer, at least a portion of the substrate layer disposed at an interface between the blocking film and the substrate layer is removed.

17. The method of claim 10,
wherein, in the separating of the substrate layer, the substrate layer is separated from the supporting substrate by irradiating the second surface of the supporting substrate with a laser beam.

18. The method of claim 17,
wherein, in the separating of the substrate layer, the blocking film is not separated from the supporting substrate when the substrate layer is separated from the supporting substrate.

19. The method of claim 10,
wherein the substrate layer is a flexible substrate.

20. The method of claim 10,
wherein, in the removing at least a portion of the substrate layer, a spacing region in which at least a portion of the substrate layer is exposed through the predetermined distance is formed,
the forming of the display unit includes forming an inorganic layer on the substrate layer, and
at least a portion of the inorganic layer is in contact with the spacing region of the substrate layer.

21. The method of claim 20, further comprising:
removing the inorganic layer formed on the spacing region of the substrate layer before the separating of the substrate layer.

* * * * *